(12) United States Patent
Oh

(10) Patent No.: US 7,616,038 B2
(45) Date of Patent: Nov. 10, 2009

(54) CLOCK MODULATION CIRCUIT FOR CORRECTING DUTY RATIO AND SPREAD SPECTRUM CLOCK GENERATOR INCLUDING THE SAME

(75) Inventor: Young-Hoon Oh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 126 days.

(21) Appl. No.: 11/878,305

(22) Filed: Jul. 23, 2007

(65) Prior Publication Data

US 2008/0191751 A1    Aug. 14, 2008

(30) Foreign Application Priority Data

Feb. 13, 2007    (KR)    ............ 10-2007-0014675

(51) Int. Cl.
*H03K 3/017* (2006.01)
(52) U.S. Cl. ............ 327/172; 327/175; 327/263
(58) Field of Classification Search ............ 327/170, 327/172–176, 263, 264, 277, 278, 284, 285, 327/291, 298, 299
See application file for complete search history.

(56) References Cited

U.S. PATENT DOCUMENTS

| 6,501,307 | B1 | 12/2002 | Yen |
| 6,501,313 | B2 * | 12/2002 | Boerstler et al. ............ 327/175 |
| 6,559,726 | B1 | 5/2003 | Stansell |
| 6,606,005 | B2 | 8/2003 | Chang |
| 6,850,554 | B1 | 2/2005 | Sha et al. |
| 6,975,148 | B2 | 12/2005 | Miyata et al. |
| 7,061,293 | B2 | 6/2006 | Fukushima |
| 7,279,946 | B2 * | 10/2007 | Minzoni ............ 327/158 |
| 7,322,001 | B2 * | 1/2008 | Boerstler et al. ............ 714/733 |
| 2002/0084817 | A1 * | 7/2002 | Nair et al. ............ 327/175 |
| 2005/0053120 | A1 | 3/2005 | Kim et al. |
| 2007/0041486 | A1 | 2/2007 | Shin |
| 2008/0012617 | A1 * | 1/2008 | Boerstler et al. ............ 327/175 |

FOREIGN PATENT DOCUMENTS

| JP | 2005085173 | 3/2005 |
| JP | 2006148840 | 6/2006 |
| JP | 2006211479 | 8/2006 |
| JP | 2006333174 | 12/2006 |
| KR | 1020010005877 | 1/2001 |

OTHER PUBLICATIONS

Hardin et al., "Spread Spectrum Clock Generation for the Reduction of Radiated Emissions", IEEE International Symposium on Electromagnetic Compatibility, pp. 227-231, 1994.

* cited by examiner

*Primary Examiner*—An T Luu
(74) *Attorney, Agent, or Firm*—Venable LLP; Jeffri A. Kaminski

(57) ABSTRACT

A clock modulation circuit includes a modulation block that receives a fixed clock generated from a reference clock and buffers the fixed clock so as to generate a modulated clock. A correction unit is provided in the modulation block to correct the duty ratio of the modulated clock.

30 Claims, 21 Drawing Sheets

FIG. 6

| CYCLE | 1 | 2 | 3 | 4 | 5 | 6 | 7 | 8 |
|---|---|---|---|---|---|---|---|---|
| Rising Delay Step | 0 | 0 | 2 | 6 | 8 | 8 | 6 | 2 |
| CTRL1 | H | H | L | L | L | L | L | L |
| CTRL2 | H | H | L | L | L | L | L | L |
| CTRL3 | H | H | H | L | L | L | L | H |
| CTRL4 | H | H | H | L | L | L | L | H |
| CTRL5 | H | H | H | H | L | L | L | H |
| CTRL6 | H | H | H | H | L | L | L | H |
| CTRL7 | H | H | H | H | L | L | H | H |
| CTRL8 | H | H | H | H | L | L | H | H |

FIG. 7

| CYCLE | 1 | 2 | 3 | 4 | 5 | 6 | 7 | 8 |
|---|---|---|---|---|---|---|---|---|
| Falling Delay Step | 0 | 1 | 4 | 7 | 8 | 7 | 4 | 1 |
| CTRL9 | H | L | L | L | L | L | L | L |
| CTRL10 | H | H | L | L | L | L | L | H |
| CTRL11 | H | H | L | L | L | L | L | H |
| CTRL12 | H | H | L | L | L | L | L | H |
| CTRL13 | H | H | H | L | L | L | H | H |
| CTRL14 | H | H | H | L | L | L | H | H |
| CTRL15 | H | H | H | L | L | L | H | H |
| CTRL16 | H | H | H | H | L | H | H | H |

…

CLOCK MODULATION CIRCUIT FOR CORRECTING DUTY RATIO AND SPREAD SPECTRUM CLOCK GENERATOR INCLUDING THE SAME

CROSS-REFERENCE TO RELATED PATENT APPLICATION

This application claims the benefit of Korean Patent Application No. 10-2006-0014675, filed on Feb. 13, 2007, in the Korean Intellectual Property Office, the disclosure of which is incorporated herein in its entirety by reference.

BACKGROUND OF THE INVENTION

1. Technical Field

The present invention relates to a semiconductor integrated circuit, and in particular, to a clock modulation circuit for correcting a duty ratio and a spread spectrum clock generator including the same.

2. Related Art

In recent years, as an integration speed and components per chip of a semiconductor apparatus increase, an EMI (electromagnetic interference) problem occurs due to electromagnetic wave radiation in a semiconductor apparatus. In particular, while an operation frequency increases, a wavelength is gradually shortened, and the length of a wiring line in a connection circuit or a substrate becomes just as short as the wavelength of a high-frequency signal. In such a minute semiconductor integrated circuit, an interconnection part, such as the wiring line, serves as an antenna, and thus the amount of electromagnetic wave radiation increases. Further, in an electronic apparatus that uses a semiconductor apparatus, which operates at a high frequency, the electromagnetic waves that are radiated due to the above-described reasons cause mutual interference between electronic apparatuses and signal interference of communication apparatuses.

A general electronic apparatus prevents electromagnetic wave radiation by measuring electromagnetic waves and changing the arrangement of the circuit or by shielding the electronic apparatus with a steel plate.

But, with a rapid increase of use in the portable apparatus, a small and light-weight electronic apparatus is demanded. For this reason, the method of changing the arrangement of the circuit and the method of shielding the electronic apparatus with the steel plate also have limitations.

Thus, in the related art, there is suggested a spread spectrum clock generator (SSCG) that performs a spread spectrum processing in order to modulate an operation clock frequency of a semiconductor apparatus. This is disclosed in U.S. Pat. No. 6,501,307.

In U.S. Pat. No. 6,501,307, a load capacitor is provided in a delay modulator that generates a modulated clock, thereby sufficiently securing a cycle of a spectrum modulation signal.

However, in such a known spread spectrum clock generator, although the cycle of the spectrum modulation signal can be secured through clock modulation, the duty ratio of the clock is changed, which results in duty ratio distortion. The duty ratio distortion may cause a signal error to affect the entire electronic apparatus, resulting in an adverse affect on the system operation.

SUMMARY OF THE INVENTION

An embodiment of the present invention provides a clock modulation circuit that can adjust a duty ratio.

Another embodiment of the present invention provides a spread spectrum clock generator that can prevent duty ratio distortion.

According to an embodiment of the invention, a clock modulation circuit may include a modulation block that may receive a fixed clock generated from a reference clock and buffer the fixed clock so as to generate a modulated clock. A correction unit may be provided in the modulation block to correct the duty ratio of the modulated clock.

The correction unit may correct the duty ratio by delaying a rising timing and a falling timing of the modulated clock. The correction unit may include at least one correction section that adjusts the rising timing of the modulated clock, and at least one correction section that adjusts the falling timing of the modulated clock.

The correction section may include a switching section that may have a plurality of switching elements connected in series, an impedance section that may have a plurality of impedance elements correspondingly connected in parallel to the switching elements and connected in series to each other, and a control section that may generate a plurality of control signals for driving the plurality of switching elements. Each of the switching elements may be one of a NMOS transistor, a PMOS transistor, and a transmission gate. Further, the plurality of impedance elements may be resistors that are connected in series to each other and correspondingly connected in parallel to the switching elements. A period in one cycle of the modulated clock may be divided by as much as the number of switching elements or the number of impedance elements, and the pulse width thereof may be adjusted.

The control section may include a multi-pulse generation section that may generate a plurality of clock pulses, for example, as many as the number of switching elements, and a control signal generation section that may combine the plurality of clock pulses from the multi-pulse generation section so as to generate a control signal. The plurality of clock pulses generated by the multi-pulse generation section may have a pulse width corresponding to one cycle of a reference control clock, and the individual clock pulses may be pulsed while being sequentially and successively shifted. The multi-pulse generation section may further include a plurality of DQ flip-flops that are connected in series, to which the reference control clock is input, and the plurality of clock pulses may be respectively generated from output terminals of the DQ flip-flops. Further, the multi-pulse generation section may further include a first pulse generation section that logically combines the clock pulses from the output terminals of the DQ flip-flops, and the first pulse generation section may be configured such that a pulse is generated when all of the clock pulses are at a low level. The control signal generation section may include a plurality of pulse combination sections that combine at least two of the plurality of clock pulses so as to generate a specific control signal.

Each of the pulse combination sections may include an adder that may receive two clock pulses among the plurality of clock pulses and generate an output having two pulsed portions, a circuit section that may change the state of a clock in synchronization with an earlier output pulse from the output of the adder, then maintain the state of the clock, and subsequently change the state of the clock in synchronization with a subsequent output pulse from the output of the adder, and an inverter that may invert the output of the circuit section. The circuit section may be a DQ flip-flop.

The control signal generation section may further include a pulse modification section that may reduce the width of the clock pulse. When the pulsed portions of the two clock pulses input to the adder are successive and a single pulse is generated from the adder, the pulse width of the clock pulse having an earlier pulsed portion of the two clock pulses may be reduced, such that the adder outputs an output signal having two pulsed portions.

The modulation block may include a first inverter that inverts the fixed clock and has a first NMOS transistor and a first PMOS transistor, a second inverter that may invert the output of the first inverter and has a second NMOS transistor and a second PMOS transistor, a first rising timing correction section that may be coupled between the first PMOS transistor and an output terminal of the first inverter, a first falling timing correction section that may be coupled between the first NMOS transistor and the output terminal of the first inverter, a second rising timing correction section that may be coupled between the second PMOS transistor and an output terminal of the second inverter, and a second falling timing correction section that may be coupled between the second NMOS transistor and the output terminal of the second inverter.

The clock modulation circuit according to an embodiment of the invention may further include a PLL (Phase Locked Loop) that is provided between the input circuit block and the modulation block to recover a clock input from the input circuit block and supply the fixed clock to the modulation block.

According to another embodiment of the invention, a spread spectrum clock generator that may spread the frequency spectrum of an input clock may include an input circuit block that may buffer a reference clock so as to generate a fixed clock, a modulation block that may spread the frequency spectrum of the fixed clock so as to generate a modulated clock, and has a correction unit for correcting the duty ratio of the modulated clock, and an output circuit block that may buffer the modulated clock so as to generate an output clock. The correction unit may correct the duty ratio by delaying a rising timing and a falling timing of the modulated clock.

According to still another embodiment of the invention, a spread spectrum clock generator that may spread the frequency spectrum of an input clock may include an input circuit block that may buffer a reference clock so as to generate a fixed clock, a modulation block that may spread the frequency spectrum of the fixed clock so as to generate a modulated clock, and has a correction unit for delaying rising and falling timing of the modulated clock so as to correct the duty ratio, and an output circuit block that may buffer the modulated clock so as to generate an output clock. At this time, the correction unit may include a switching section that has a plurality of switching elements connected in series, an impedance section that has a plurality of impedance elements correspondingly connected in parallel to the switching elements and connected in series to each other, and a control section that has a multi-pulse generation section for generating a plurality of clock pulses, for example as many as the number of switching elements, and a control signal generation section for combining the plurality of clock pulses from the multi-pulse generation section so as to generate a control signal.

BRIEF DESCRIPTION OF THE DRAWINGS

FIG. 6 is a table showing the number of rising delay steps per cycles for correcting the duty ratio of the modulated clock and the levels of control signals for obtaining the number of rising delay steps according to an embodiment of the invention;

FIG. 7 is a table showing the number of falling delay steps per cycles for correcting the duty ratio of the modulated clock and the levels of control signals for obtaining the number of falling delay steps according to an embodiment of the invention;

DESCRIPTION OF EXEMPLARY EMBODIMENTS

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Exemplary embodiments of the present invention may provide a clock modulation circuit that may correct a duty ratio by delaying a rising timing and a falling timing, and a spread spectrum clock generator including the same. Whether or not to delay the rising timing and the falling timing may be determined on the basis of an initial delay portion of a modulated clock. The rising timing and the falling timing may be delayed by a delay section having switching elements and impedance elements. With a simple delay method, the rising timing and the falling timing of the modulated clock may be adjusted, such that a modulated clock having a corrected duty ratio and dispersed EMI may be supplied.

An example of the clock modulation circuit and the spread spectrum clock generator having the same will be described in detail.

Figure 1:
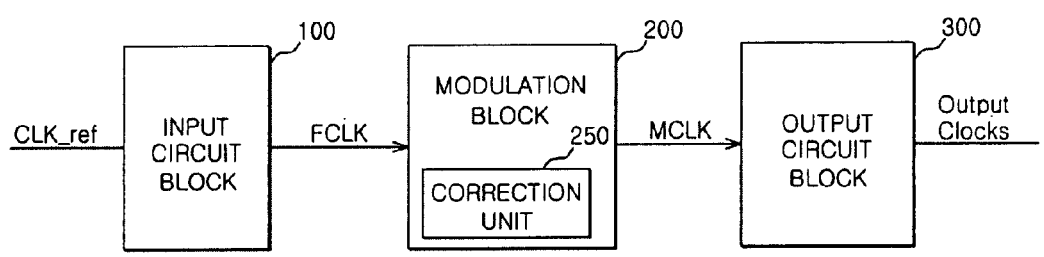
FIG. 1 is a block diagram showing a spread spectrum clock generator according to an embodiment of the invention.

Referring to FIG. 1, a spread spectrum clock generator according to an embodiment of the invention includes an input circuit block 100, a modulation block 200, and an output circuit block 300.

The input circuit block 100 includes an input buffer that receives a reference clock CLK_ref to buffer the reference clock CLK_ref. The input circuit block 100 generates a fixed clock FCLK from the input reference clock CLK_ref. At this time, the frequency of the fixed clock FCLK may be fixed or stabilized. Further, the frequency of the fixed clock may include an undesired electromagnetic wave.

The modulation block 200 receives the fixed clock FCLK to generate a modulated clock MCLK. The modulation block 200 includes a correction unit 250 that correct the duty ratio of the modulated clock MCLK. The correction unit 250 may adjust the duty ratio of the modulated clock MCLK by delaying the rising timing and the falling timing of the modulated clock MCLK. Further, as the modulated clock MCLK is generated, the frequency of the modulated clock MCLK is also modulated, such that an EMI corresponding to a peak among frequencies beyond a frequency range is dispersed.

The output circuit block 300 buffers the modulated clock MCLK so as to generate an output clock. The output circuit block 300 may be an output driver. The output circuit block 300 may have divergent logic circuit sections in order to generate output clocks for driving different system components.

Figure 2:
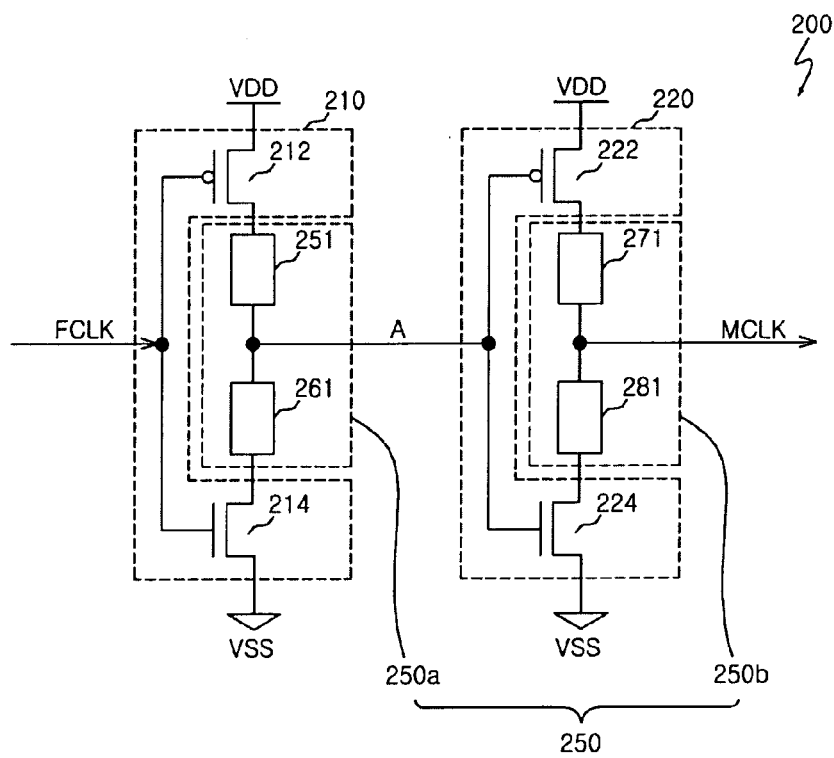
FIG. 2 is a circuit diagram schematically showing a modulation block shown in FIG. 1.

Referring to FIG. 2, the modulation block 200 includes a first inverter 210, a second inverter 220, and a correction unit 250.

The first inverter 210 receives the fixed clock FCLK, and inverts and amplifies the fixed clock FCLK. The first inverter 210 includes a first PMOS transistor 212 that has a gate, to which the fixed clock FCLK is input, and a source connected to a power supply voltage VDD, and a first NMOS transistor 214 that has a gate, to which the fixed clock FCLK is input, and a source connected to a ground voltage VSS. In the first inverter 210, the drain of first PMOS transistor 212 and the drain of the first NMOS transistor 214 are electrically coupled to each other.

The second inverter 220 receives an output signal A of the first inverter 210, and inverts and amplifies the output signal A so as to generate the modulated clock MCLK. The second inverter 220 includes a second PMOS transistor 222 that has a gate, to which the output signal A of the first inverter 210 is input, and a source connected to the power supply voltage VDD, and a second NMOS transistor 224 that has a gate, to which the output signal A of the first inverter 210 is input, and a source connected to the ground voltage VSS. Similarly to the first inverter 210, in the second inverter 220, the drain of the second PMOS transistor 222 and the drain of the second NMOS transistor 224 are electrically coupled to each other.

The correction unit 250 includes a first correction unit 250a that adjusts the output level of the first inverter 210, and a second correction unit 250b that adjusts the output level of the second inverter 220.

The first correction unit 250a includes a first correction section 251 that is connected between the drain of the first PMOS transistor 212 and the output terminal of the first inverter 210, and a second correction section 261 that is connected between the output terminal of the first inverter 210 and the drain of the first NMOS transistor 214. Further, the second correction unit 250b includes a third correction section 271 that is connected between the drain of the second PMOS transistor 222 and the output terminal of the second inverter 220, and a fourth correction section 281 that is connected between the output terminal of the second inverter 210 and the drain of the second NMOS transistor 224.

Figure 3A:
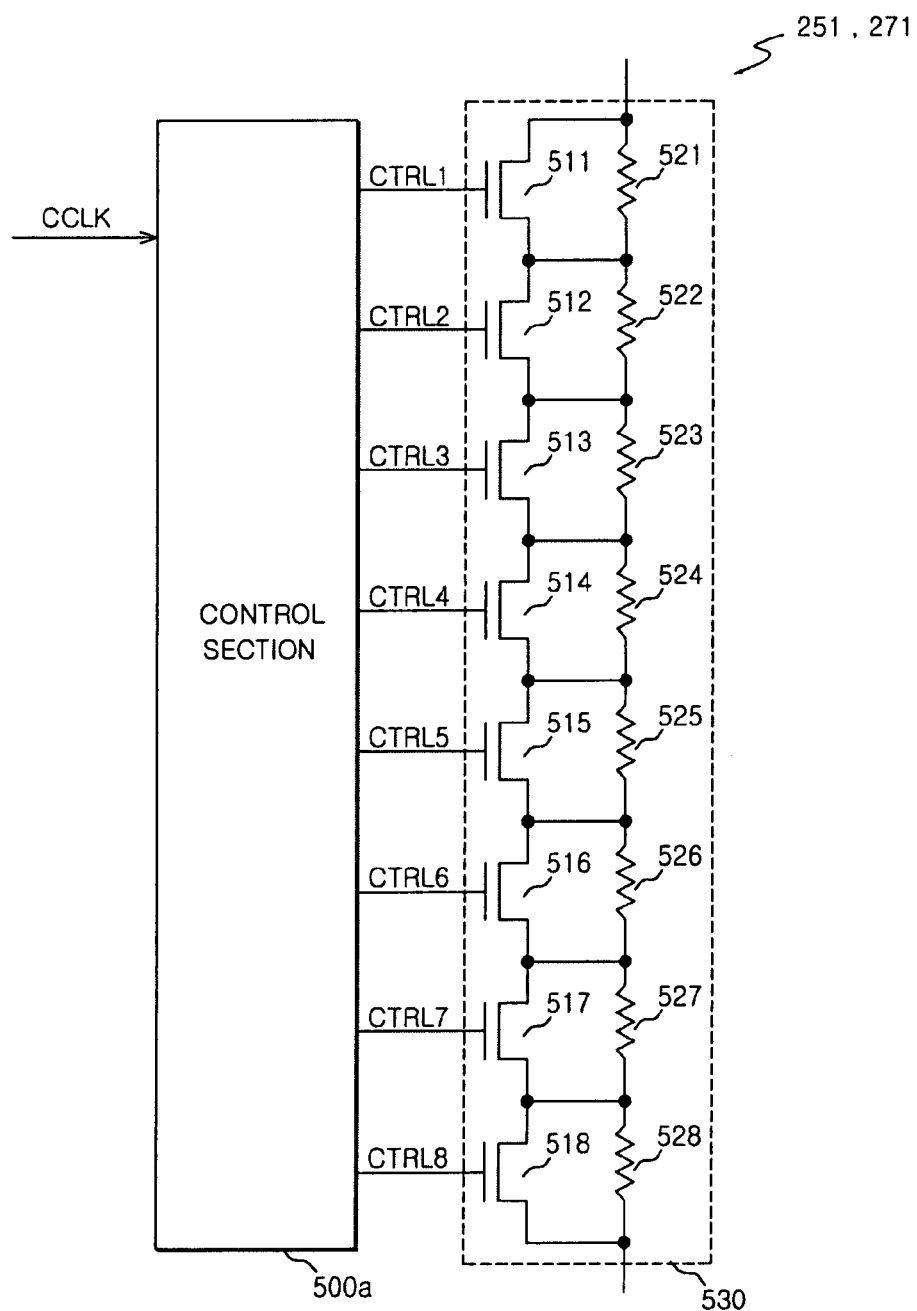
FIGS. 3A and 3B are circuit diagrams showing the detailed configuration of a correction section according to an embodiment of the invention.
Figure 3B:
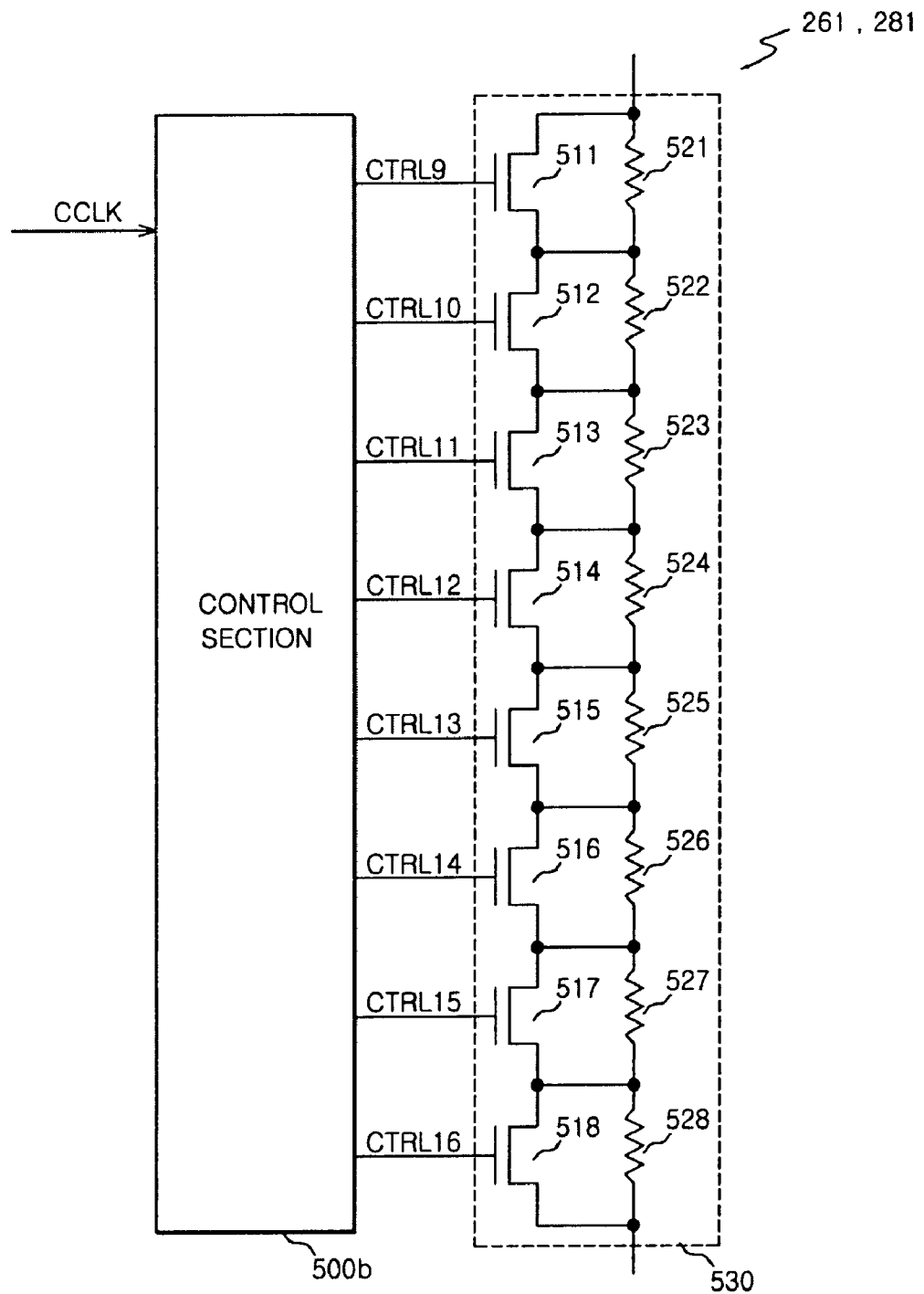

FIGS. 3A and 3B are circuit diagrams showing the configuration of a correction section according to an embodiment of the invention. Specifically, FIG. 3A shows an internal circuit of the first or third correction section 251 or 271 that operate during rising of the fixed clock FCLK. FIG. 3B shows an internal circuit of the second or fourth correction section 261 or 281 that operate during falling of the fixed clock FCLK. As shown in FIGS. 3A and 3B, the configuration of the first or third correction section 251 or 271 and the configuration of the second or fourth correction section 261 or 281 are substantially the same, except that control signals to be supplied thereto are different from each other. Therefore, in this embodiment, the first to fourth correction sections 251, 261, 271, and 281 will be collectively described.

First, referring to FIGS. 3A and 3B, the correction section 251, 261, 271, or 281 includes a control section 500a or 500b that receives the reference control clock CCLK to generate a plurality of control signals CTRL1 to CTRL8 or CTRL9 to CTRL16, and a delay section 530 that determines a delay amount (degree of delay or delay time) on the basis of the control signals CTRL1 to CTRL8 or CTRL9 to CTRL16 from the control section 500a or 500b.

The delay section 530 includes a plurality of switching sections 511 to 518 that are respectively driven by the plurality of control signals CTRL1 to CTRL8 or CTRL9 to CTRL16, and a plurality of impedance sections 521 to 528 that are correspondingly connected in parallel to the plurality of switching sections. The plurality of switching sections 511 to 518 may be connected in series, and the impedance sections 521 to 528 may also be connected in series. In addition, in this embodiment, the plurality of switching sections 511 to 518 may be composed of NMOS transistors, and the impedance sections 521 to 528 may be resistors that are correspondingly connected in parallel to the switching sections (NMOS transistors). The number of switching sections 511 to 518 and the number of impedance sections 521 to 528 may be the same as the number of divisions of a period (low period or high period) of the reference control clock CCLK. That is, a period in one cycle of the modulated clock MCLK is divided as many times as the number of switching sections 518 to 518 (or the number of impedance sections 521 to 528) and then the pulse width thereof is adjusted. In this embodiment, a period in one cycle of the clock is divided into eight steps, and accordingly eight switching sections 511 and 518 and eight impedance sections 521 and 528 are provided. Of course, other numbers of divisions are also possible. Further, in the control section 500, eight control signals CTRL are needed.

Here, the relationship between the delay amount of the delay section 530 and correction of the duty ratio of the modulated clock MCLK will be described in detail.

Figure 4:
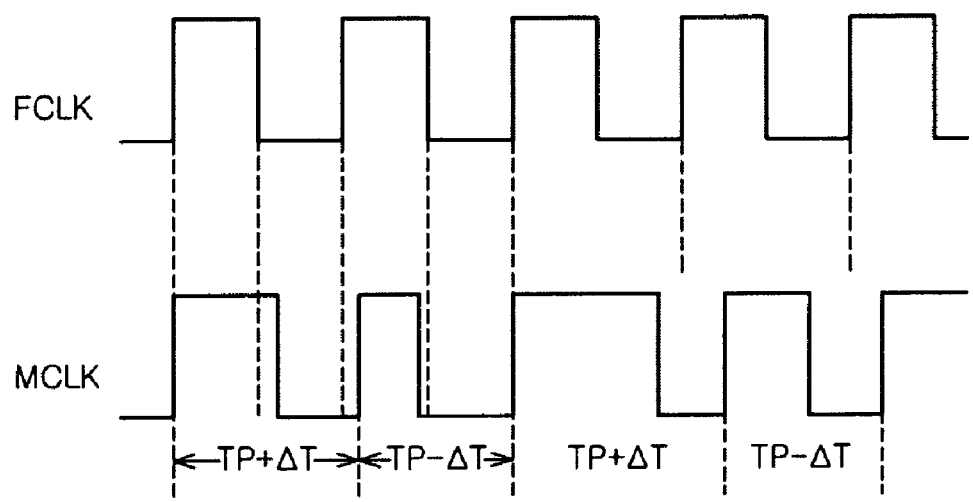
FIG. 4 is a timing chart showing a modulated clock of a general spread spectrum clock generator according to an embodiment of the invention.

As described above in the related art, the modulated clock MCLK generated in the general spread spectrum clock generator does not have a uniform duty ratio compared with the fixed clock FCLK, as shown in FIG. 4.

In the spread spectrum clock generator according to this embodiment, in order to solve this problem, that is, duty ratio distortion, the duty ratio of the modulated clock MCLK is corrected by delaying the rising timing and the falling timing of the modulated clock MCLK using the delay section 530 in the correction unit 250.

FIGS. 5A to 5C are diagrams illustrating an exemplary principle for correcting the duty ratio of the modulated clock MCLK according to an embodiment of the invention. Specifically, FIG. 5A shows a case where a period of the fixed clock FCLK is divided into eight steps in total. FIG. 5B is a table showing the number of rising delay steps and the number of falling delay steps for correcting the duty ratio of the modulated clock MCLK. FIG. 5C is a graph showing a change in delay step according to the cycle of the modulated clock.

As shown in FIGS. 5A to 5C, a first cycle of the modulated clock MCLK is the same as a first cycle of the fixed clock FCLK with no change in duty ratio.

Meanwhile, the falling timing in a second cycle of the modulated clock MCLK is delayed by one step from the falling timing in a second cycle of the fixed clock FCLK due to the internal resistance of elements constituting the first and second inverters 210 and 220 and the resistance of wiring lines connecting the elements. Accordingly, in the table of FIG. 5B, the number of falling delay steps in the second cycle is written as "1". Then, in order to adjust the duty ratio in the second cycle of the modulated clock MCLK, the rising timing in a third cycle of the modulated clock MCLK needs to be delayed by two steps from the rising timing in a third cycle of the fixed clock FCLK. Subsequently, the high and low periods in the second cycle of the modulated clock MCLK all include eight steps. Since the rising timing in the third cycle of the modulated clock MCLK is delayed by the two steps in order to adjust the duty ratio in the second cycle of the modulated clock MCLK, in the table of FIG. 5, the number of rising delay steps in the third cycle is written as "2".

When the duty ratio in the second cycle in the modulated clock MCLK is corrected, the falling timing in the third cycle of the modulated clock MCLK needs to be delayed by four steps from the falling timing in the third cycle of the fixed clock FCLK. Accordingly, the falling timing in the third cycle of the modulated clock MCLK becomes "4". Further, in order to adjust the duty ratio in the third cycle of the modulated clock MCLK, the rising timing in a fourth cycle of the modulated clock MCLK needs to be delayed by six steps from the rising timing in a fourth cycle of the fixed clock FCLK. Accordingly, the high and low periods in the third cycle of the modulated clock MCLK are equalized, and thus the duty ratio in the third cycle of the modulated clock MCLK is adjusted. The number of rising delay steps in the third cycle becomes "6".

Subsequently, when the duty ratio in the third cycle is corrected, the falling timing in the fourth cycle of the modulated clock MCLK is delayed by seven steps from the falling timing in the fourth cycle of the fixed clock FCLK. Accordingly, if the rising timing in a fifth cycle of the modulated clock MCLK is delayed by eight steps from the rising timing in a fifth cycle of the fixed clock FCLK, the duty ratio in the fourth cycle can be adjusted.

When the duty ratio in the fourth cycle is corrected, the falling timing in the fifth cycle of the modulated clock MCLK is delayed by eight steps from the falling timing in the fifth cycle of the fixed clock FCLK. Accordingly, if the rising timing in a sixth cycle of the modulated clock MCLK is delayed by eight steps from the rising timing in a sixth cycle of the fixed clock FCLK, the duty ratio in the fifth cycle can be adjusted.

Although a detailed description is omitted, sixth to eighth cycles that are successively generated after the fifth cycle are continuously delayed according to the above-described rules, such that the duty ratio can be adjusted.

As described above, in order to correct the duty ratio of the modulated clock MCLK, the rising timing of the modulated clock may be delayed according to the exemplary repetitive rule "0, 0, 2, 6, 8, 8, 6, 2, 0, 0, . . . ", and the falling timing may be delayed according to the exemplary repetitive rule "0, 1, 4, 7, 8, 7, 4, 1, 0, 1, . . . ", as shown in FIGS. 5A to 5C. In this manner, the duty ratio can be adjusted.

In this embodiment, the number of rising delay steps and the number of falling delay steps are determined according to how many of the switching sections 511 to 518 shown in FIG. 3 are turned on. That is, if the switching sections 511 to 518 shown in FIG. 3 are all turned on, the delay amount of the delay section 530 becomes "0". Further, for example, if two successively connected switching sections among the plurality of switching sections 511 to 518 are turned on, six impedance sections operate, and thus the rising or falling timing of the modulated clock MCLK is delayed by six steps.

FIG. 6 is a table showing an example of the number of rising delay steps per cycles for correcting the duty ratio of the modulated clock MCLK, and the levels of the control signals CTRL1 to CTRL8 to be supplied to the delay section 530 for obtaining the number of rising delay steps according to an embodiment of the invention. In FIG. 6, with respect to the control signals CTRL1 to CTRL8, eight switching sections 511 to 518 are provided, and NMOS transistors are used as the switching sections 511 to 518.

Referring to FIG. 6, if the rising delay is "0", all of the control signals CTRL1 to CTRL8 are at the high level. Then, all of the switching sections 511 to 518 are turned on, the signal transmission to the impedance sections 521 to 528 is not performed. Accordingly, a signal delay does not occur. At this time, internal resistance in the switching elements and the wiring lines is negligible.

When the number of rising delay steps is "2", the first and second control signals CTRL1 and CTRL2 are at the low level, and the third to eighth control signals CTRL3 to CTRL8 are at the high level. Then, the first and second switching sections 511 and 512 are turned off, and signals supplied from power supply sections of the first inverter 210 and/or the second inverter 220 flow in the first and second impedance sections 521 and 522 that are correspondingly connected in parallel to the first and second switching sections 511 and 512. Accordingly, a signal delay occurs.

When the number of rising delay steps is "6", the first to sixth control signals CTRL1 to CTRL6 are at the low level, and the seventh and eighth control signals CTRL7 and CTRL8 are at the high level. Then, the first to sixth switching sections 511 to 516 are turned off, and the signals supplied from the power supply sections of the first inverter 210 and/or the second inverter 220 pass through the first to sixth impedance sections 521 to 526 and then the seventh and eighth switching sections 517 and 518, thereby causing a delay by six steps.

Similarly, when the number of rising delay steps is "8", the first to eighth control signals CTRL1 to CTRL8 are all at the low level. Then, the first to eighth switching sections 511 to 518 are all turned off, and the signals supplied from the power supply sections of the first inverter 210 and/or the second inverter 220 pass through all of the impedance sections 521 to 528, without passing through the switching sections 511 to 518, thereby causing a delay by eight steps.

However, as shown in the table of FIG. 6, the control signals CTRL1 to CTRL8 may be set according to a specific rule. That is, the first to eighth control signals CTRL1 to CTRL8 may be set according to a repetitive delay rule, for example, "0, 0, 2, 6, 8, 8, 6, 2, 0, . . . " per cycles. Further, the first and second control signals CTRL1 and CTRL2 have the same level in all of the cycles, the third to sixth control signals CTRL3 to CTRL6 have the same level in all of the cycles, and the seventh and eighth control signals CTRL7 and CTRL8 have the same level in all of the cycles. Therefore, the first and second control signals CTRL1 and CTRL2, the third to sixth control signals CTRL3 to CTRL6, and the seventh or eighth control signals CTRL7 and CTRL8 are generated simultaneously by a single circuit section.

Similarly to the rising timing delay, as shown in FIG. 5B, the falling timing may also be repeated in an exemplary sequence of "0, 1, 4, 7, 8, 8, 7, 4, 1, 0" per cycles of the modulated clock MCLK. The duty ratio of the modulated clock MCLK can be adjusted by delaying the falling timing in this sequence. For the delay of the falling timing, the correction sections 251 and 281 that determine the falling timing should supply the ninth to sixteenth control signals CTRL9 to CTRL16 that satisfy the above-described rule, as shown in FIG. 7. The correction principle of the duty ratio by the control signals CTRL9 to CTRL16 for controlling the falling timing may be the same as the correction principle of the rising timing, and thus the description thereof will be omitted.

Meanwhile, the configuration of the control section 500 that generates the first to eighth control signals CTRL1 to CTRL8 and the ninth to sixteenth control signals CTRL9 to CTRL16 for correcting the duty ratio is as follows.

Figure 8:
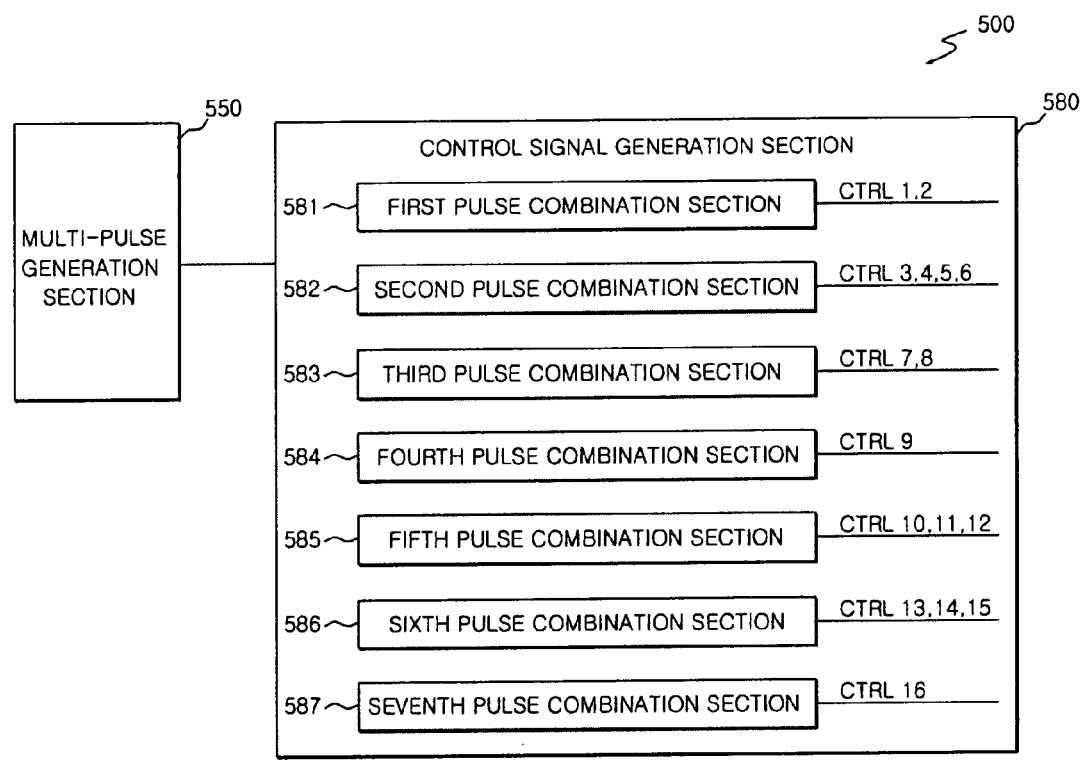
FIG. 8 is a block diagram showing a control section of a correction unit according to an embodiment of the invention.

Referring to FIG. 8, the control section 500 includes a multi-pulse generation section 550 and a control signal generation section 580.

The multi-pulse generation section 550 generates, for example, eight pulses. In order to generate the eight pulses, the multi-pulse generation section 550 includes seven DQ flip-flops 551, 552, 553, 554, 555, 556, and 557 that are connected in series (see FIG. 9). Clock pulses P1 to P7 are respectively generated from output terminals of the DQ flip-flops 551 to 557. At this time, each of the DQ flip-flops 551, 552, 553, 554, 555, 556, and 557 receives a reference control clock CCLK and a reset signal reset. As the reference control clock CCLK, the fixed clock FCLK or the reference clock CLK_ref can be used. Further, the multi-pulse generation section 550 further includes a pulse generation section 560 that generates an additional pulse. The pulse generation section 560 generates a pulse that is pulsed when all of the pulses P1 to P7 are at a low level. That is, the pulse generation section 560 combines the pulses P1 to P7 so as to generate a pulse P0. For convenience of explanation, an initially pulsed portion P0 is referred to as a first pulse, and the remaining pulsed portions are referred to as a second pulse, a third pulse, a fourth pulse, and the like in a sequence in which a pulse is generated.

Figure 9:
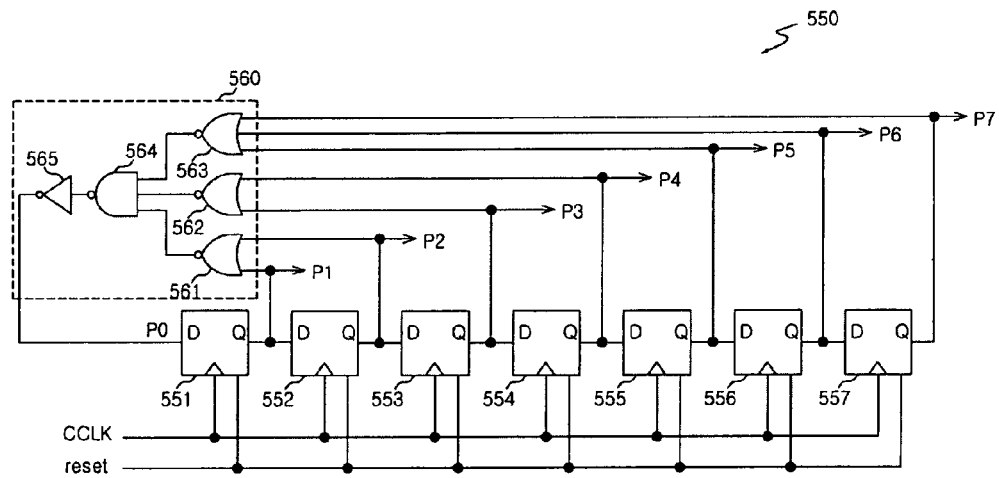
FIG. 9 is a diagram showing an exemplary internal circuit of a multi-pulse generation section that constitutes the control section shown in FIG. 8.

For example, as shown in FIG. 9, the pulse generation section 560 includes a first NOR gate 561 to which the second and third pulses P1 and P2 are input, a second NOR gate 562 to which the fourth and fifth pulses P3 and P4 are input, a third NOR gate 563 to which the sixth to eighth pulses P5, P6, and P7 are input, a NAND gate 564 to which the output signals of the first to third NOR gates 561, 562, and 563 are input, and an inverter 565 that inverts the output of the NAND gate 564.

Figure 10:
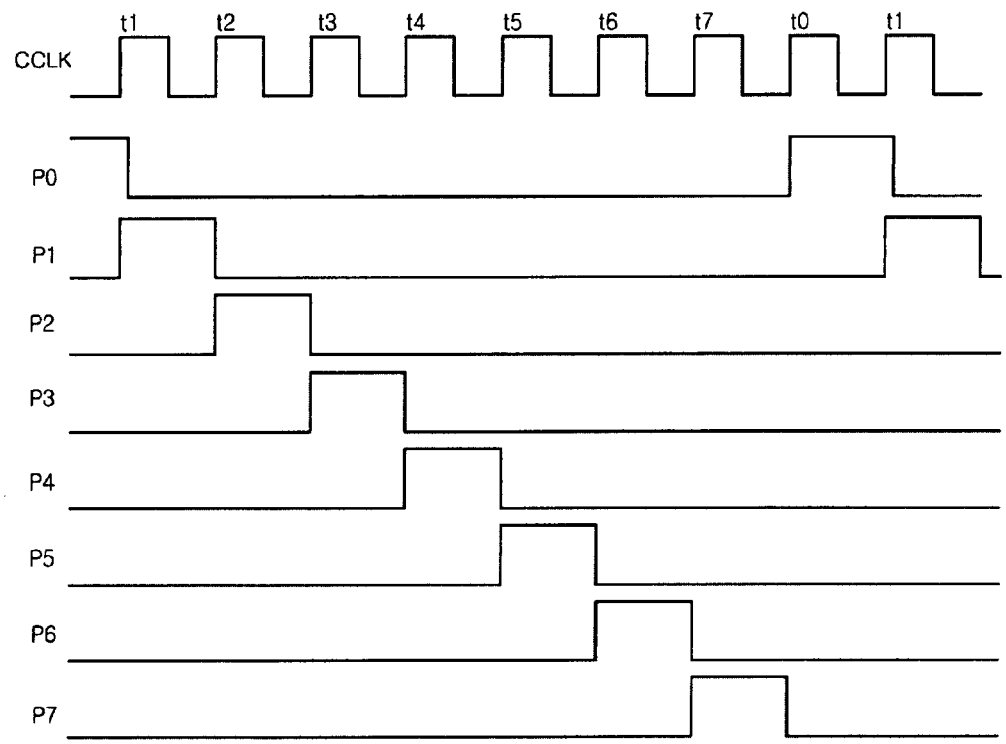
FIG. 10 is a an exemplary timing chart showing pulses that are generated from the multi-pulse generation section shown in FIG. 9.

The first to eighth pulses P0 to P7 generated by the multi-pulse generation section 550 in the above-described manner have a width corresponding to one cycle of the reference control clock CCLK by the DQ flip-flops 551 to 557, as shown in FIG. 10. Further, the first to eighth pulses P0 to P7 are sequentially and successively generated while being shifted by one cycle of the reference control clock CCLK.

As shown in FIG. 8, the control signal generation section 580 includes a first pulse combination section 581, a second pulse combination section 582, a third pulse combination section 583, a fourth pulse combination section 584, a fifth pulse combination section 585, a sixth pulse combination section 586, and a seventh pulse combination section 587. Here, the first to third pulse combination sections 581 to 583 generate the control signals CTRL1 to CTRL8 for delaying the rising timing of the modulated clock MCLK. Further, the fourth to seventh pulse combination sections 584 to 587 generate the control signals CTRL9 to CTRL16 for delaying the falling timing of the modulated clock MCLK.

Figure 11:
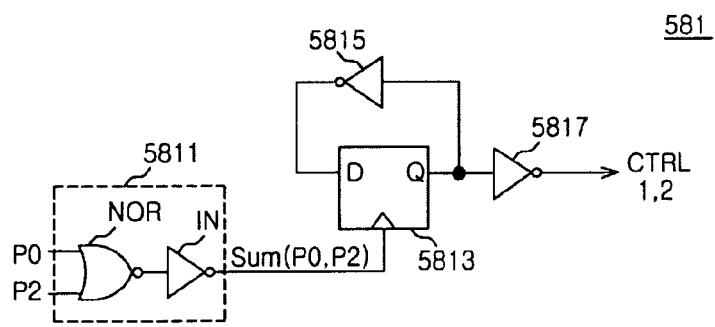
FIGS. 11, 13, 15, 17, 22, 24, and 26 are circuit diagrams showing first, second, third, fourth, fifth, sixth, and seventh pulse combination sections according to an embodiment of the invention.

First, as shown in FIG. 11, the first pulse combination section 581 combines the selected pulses so as to generate the first and second control signals CTRL1 and CTRL2 having the same output level. As shown in FIG. 6, the first and second control signals CTRL1 and CTRL2 are clock pulses that are at the high level in the first and second cycles t0 and t1, but are at the low level in the remaining cycles t2 to t7. The first and second control signals CTRL1 and CTRL2 can be generated using the first pulse P0 at the high level in only the first cycle t0 and the third pulse P2 at the high level in only the third cycle t2.

The first pulse combination section 581 includes an adder 5811 that outputs a signal having at least pulsed portions, a DQ flip-flop 5813, and an inverter 5815. The adder 5811 is a logic circuit section that adds the first pulse P0 and the third pulse P2. For example, the adder may have a NOR gate NOR that receives the first pulse P0 and the third pulse P2, and an inverter IN that inverts the output of the NOR gate. The DQ flip-flop 5813 receives the output signal of the adder 5811 as a clock. As known in the related art, the DQ flip-flop 5813 maintains the previous level until the level of the input clock changes. An inversion value of an output Q is supplied to an input D of the DQ flip-flop 5813, and the inversion value is generated by the inverter 5815. Further, the output Q of the DQ flip-flop is inverted by the inverter 5817, and forms the first and second control signals CTRL1 and CTRL2.

Figure 12:
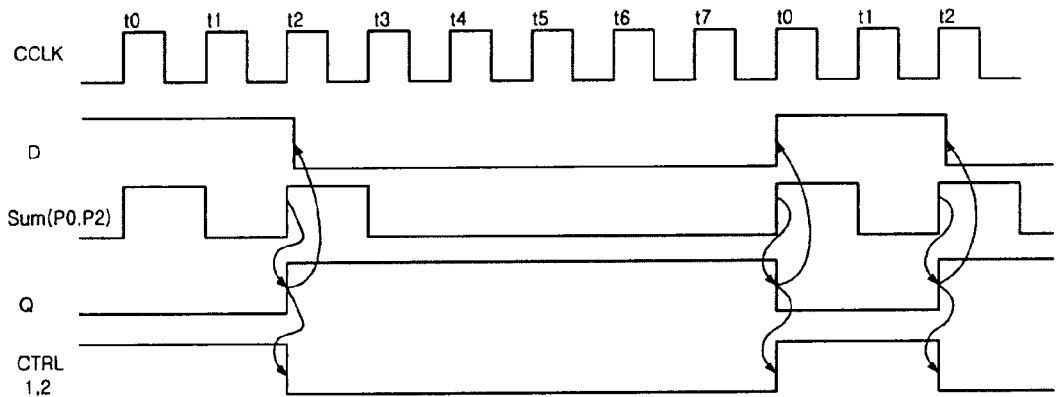
FIGS. 12, 14, 16, 21, 23, 25, and 27 are timing charts illustrating an exemplary process of generating first to sixteenth control signals from the first to seventh pulse combination sections according to an embodiment of the invention.

FIG. 12 is a timing chart showing a control clock Control CLK, the output Sum(P0,P2) of the adder, the D and Q signal levels of the DQ flip-flop, and the first and second control signals CTRL1 and CTRL2 obtained by the DQ flip-flop.

Referring to FIG. 12, the adder 5811 that receives the first pulse P0 and the third pulse P2 generates an added signal Sum(P0,P2) at a high level in only the first cycle t0 and the third cycle t2. The DQ flip-flop 5815 that receives the added signal Sum(P0,P2) as the clock generates a signal at a high level in the third cycle t2 to the eighth cycle t7 (the Q level in FIG. 12). Specifically, the DQ flip-flop 5815 maintains the previous clock state until the next rising timing of the input clock. Then, the output of the DQ flip-flop 5815 rises in synchronization with the rising timing of the third cycle t2 of the added signal Sum(P0,P2), continues to maintain the high level, and falls in synchronization with the rising timing of the first cycle t0. Accordingly, the output of the DQ flip-flop 5815 maintains the high level in the third to eighth cycles t2 to t7. In addition, the output Q of the DQ flip-flop 5815 is inverted by the inverters 5815 and 5817, such that the first and second control signals CTRL1 and CTRL2 at the high level in only the first and second cycles t0 and t1. Here, the first and second control signals CTRL1 and CTRL2 are in phase since the input D of the DQ flip-flop 5815 is the inversion value of the output Q of the DQ flip-flop.

Figure 13:
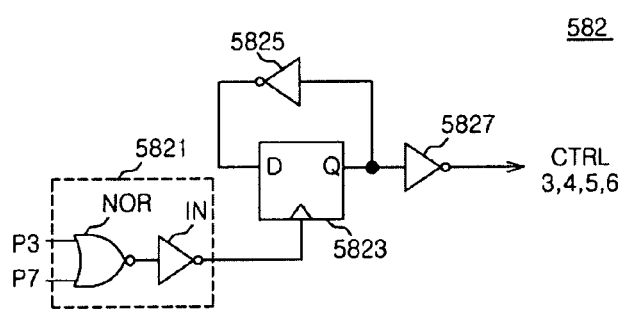

The second pulse combination section 582 combines the selected pulses so as to generate the third to sixth control signals CTRL3, CTRL4, CTRL5, and CTRL6 having the same output level. As shown in FIG. 6, the third to sixth control signals CTRL3, CTRL4, CTRL5, and CTRL6 are signals that are at the high level in the first to third cycles t0 to t2 and the eighth cycle t7, but are at the low level in the remaining cycles t3 to t6. The third to sixth control signals CTRL3, CTRL4, CTRL5, and CTRL6 are generated using the fourth pulse P3 at the high level in only the fourth cycle t3 and the eighth pulse P7 at the high level in only the eighth cycle t7. As shown in FIG. 13, similarly to the first pulse combination section 581, the second pulse combination section 582 includes an adder 5821, a DQ flip-flop 5823, and an inverter 5825. However, in the second pulse combination section 582, the signals that are input to the adder 5821 are different from those in the first pulse combination section 581.

Figure 14:
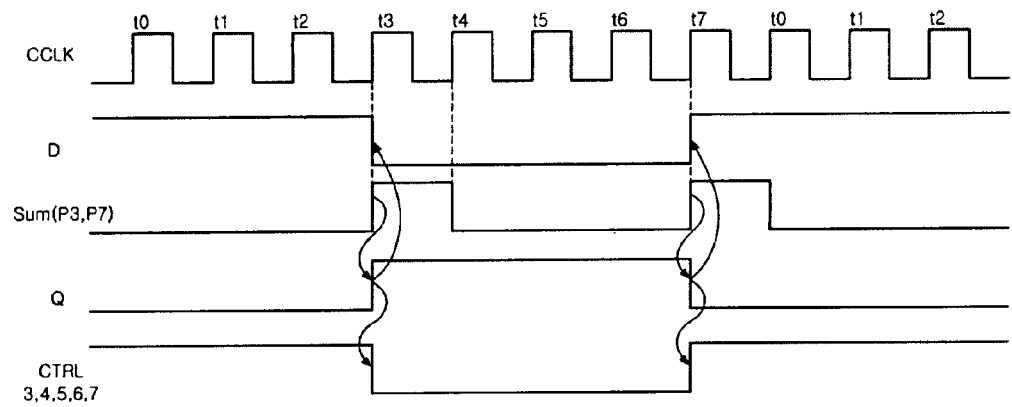

In the second pulse combination section 582, as shown in FIG. 14, the output (added signal) Sum(P3,P7) of the adder 5821 is at the high level in only the fourth cycle and the eighth cycle. The DQ flip-flop 5823 that receives the added signal Sum(P0,P2) as the clock outputs a signal at the high level in the fourth cycle t3 to the seventh cycle t6 according to the operation principle of the DQ flip-flop (the Q level in FIG. 14). The output Q of the DQ flip-flop 5823 is inverted by the inverters 5825 and 5827, such that the third to sixth control signals CTRL3 to CTRL6 at the high level in the first to third cycles t0 to t2 and the eighth cycle t7 are generated.

Figure 15:
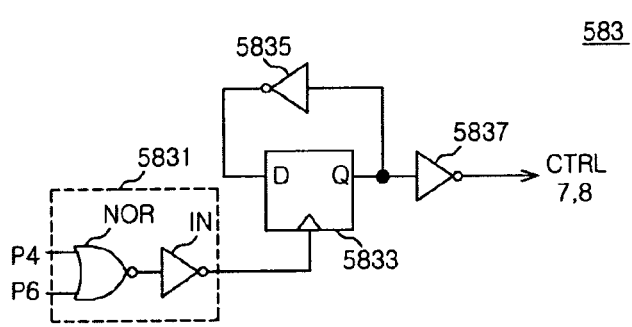

Similarly, as shown in FIG. 15, the third pulse combination section 583 also combines the selected pulses so as to generate the seventh and eighth control signals CTRL7 and CTRL8 having the same output level. As shown in FIG. 6, the seventh and eighth control signals CTRL7 and CTRL8 are signals that are at the high level in the first to fourth cycles t0 to t3 and the seventh and eighth cycles t6 and t7, but are at the low level in the remaining cycles t4 and t5. The seventh and eighth control signals CTRL7 and CTRL8 are generated using the fifth pulse P4 at the high level in the fifth cycle t4 and the seventh pulse P6 at the high level in the seventh cycle t6.

Similarly to the first pulse combination section 581, the third pulse combination section 583 includes an adder 5831, a DQ flip-flop 5833, and an inverter 5835. However, in the third pulse combination section 583, the signals that are input to the adder 5831 are the fifth pulse P4 and the seventh pulse P6, which are different from those in the first pulse combination section 581.

Figure 16:
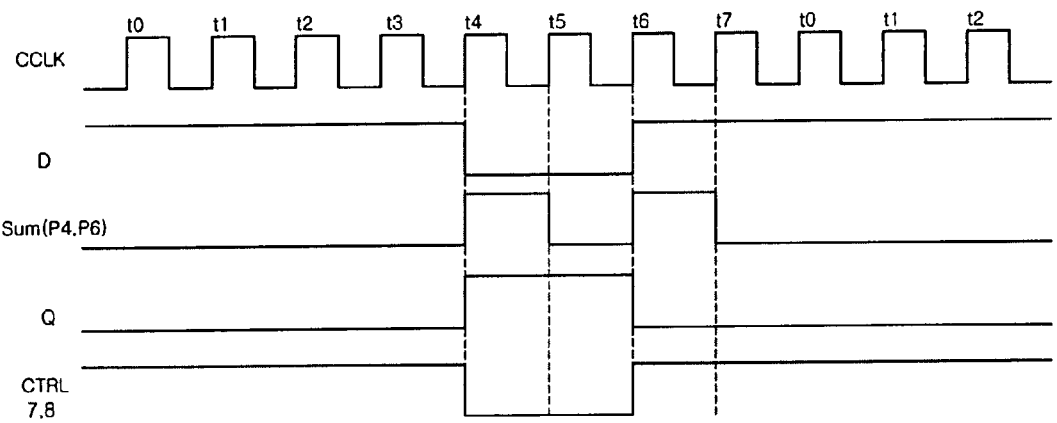

In the third pulse combination section 583, as shown in FIG. 15, the output (added signal) Sum(P4,P6) of the adder 5831 is at the high level in only the fourth cycle t5 and the seventh cycle t6. The DQ flip-flop 5823 that receives the added signal Sum(P4,P6) as the clock outputs a signal at the high level in the fifth cycle t4 and the sixth cycle t5 according to the operation principle of the DQ flip-flop (the Q level in FIG. 16). The output Q of the DQ flip-flop 5823 is inverted by the inverter 5837, such that the seventh and eighth control signals CTRL7 and CTRL8 at the high level in the first to fourth cycles t0 to t3 and the seventh and eighth cycles t6 and t7 are generated.

Meanwhile, the fourth pulse combination section 584 combines the selected pulses so as to generate the ninth control signal CTRL9. As shown in FIG. 7, the ninth control signal CTRL9 is a signal that is at the high level in only the first cycle t0 but is at the low level in the remaining cycles t1 to t7. The ninth control signal CTRL9 is generated using the first pulse P0 at the high level in only the first cycle t0 and the second pulse P1 at the high level in only the second cycle t1.

Similarly to the first pulse combination section 581, the fourth pulse combination section 584 includes an adder 5841, a DQ flip-flop 5843, and an inverter 5845. However, in the fourth pulse combination section 584, the signals that are input to the adder 5841 are a delayed first pulse P0' and the second pulse P1, which are different from those in the first pulse combination section 581.

Figure 18:
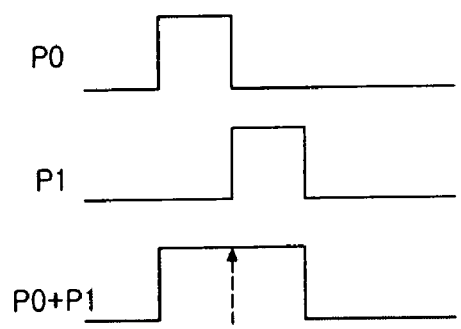
FIG. 18 is an exemplary timing chart showing an output pulse when two signals having successive pulses are added.

At this time, the reason why the delayed first pulse P0' is used instead of the normal first pulse P0 is as follows. As shown in FIG. 18, since the first pulse P0 and the second pulse P1 are successively generated with no time interval, when the two pulses P0 and P1 are added, the adder 5841 generates a single pulse, not two pulses as the output of the adder 5831. The ninth control signal CTRL9 at the high level in only the first cycle cannot be generated with the single pulse P0+P1. Therefore, it is necessary to modulate the input pulse such that the added signal Sum(P0,P1) has two pulses. Here, since the rising timing of the second pulse P2 directly determines the falling timing of the ninth control signal CTRL9, it is preferable to modulate the first pulse P0, not the second pulse P1.

Figure 19:
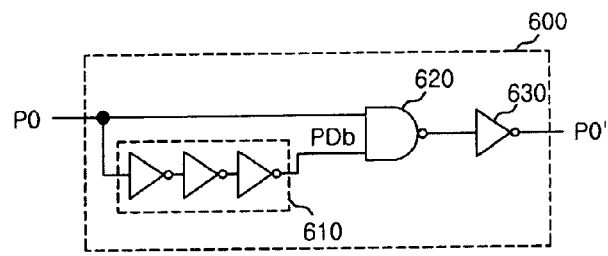
FIG. 19 is a circuit diagram showing a pulse modification section according to an embodiment of the invention.

As shown in FIG. 19, the first pulse P0 can be modulated by the pulse modification section 600. The pulse modification section 600 is a circuit that reduces the pulse width of the first pulse P0. The pulse modification section 600 includes a delay section 610 that delays the first pulse P0 for a predetermined time, a NOR gate 620 that receives the first pulse P0 and the output signal PDb of the delay section 610 and performs arithmetic, and an inverter 630 that inverts the output of the NOR gate 620. The delay section 610 is composed of, for example, an odd number of inverters connected in series.

Figure 20:
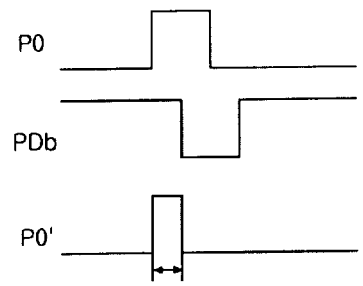
FIG. 20 is a timing chart illustrating an example of the operation of the pulse modification section shown in FIG. 19.

Referring to FIG. 20, the first pulse P0 is inverted and delayed by the delay section 610 for a predetermined time. Then, a logical AND arithmetic of the first pulse P0 and the inverted and delayed first pulse P0 is performed, such that a modified first pulse P0' having a smaller pulse width than the first pulse P0 is generated. Here, the width of the modified first pulse P0' can be adjusted by the number of inverters constituting the delay section 610.

Figure 17:
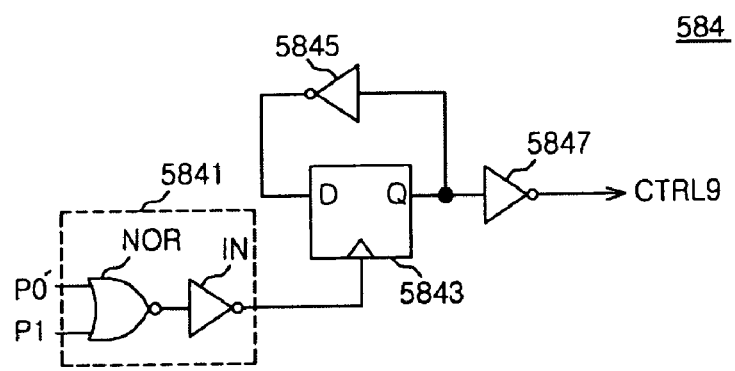
Figure 21:
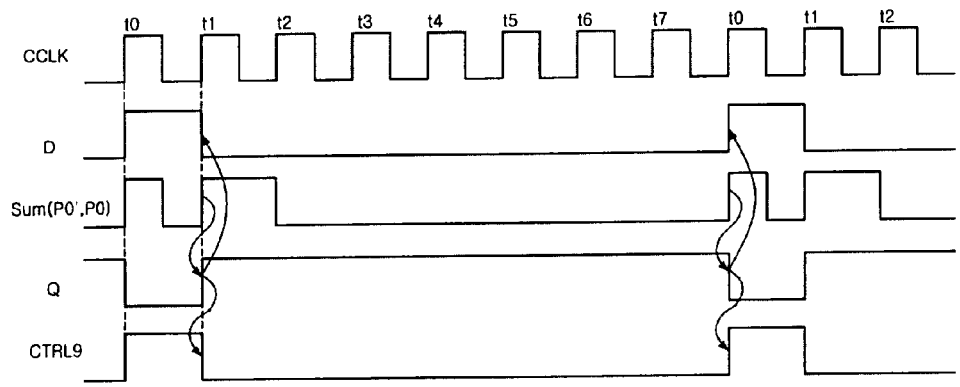

Referring to FIG. 21, the modified first pulse P0' and the second pulse P1 are input to the adder 5841 shown in FIG. 17, and the adder 5841 generates an added signal Sum(P0',P1) at the high level in a part of the first cycle t0 and the second cycle t1. The DQ flip-flop 5843 that receives the added signal Sum(P0',P1) as the clock generates a signal at the high level in the second cycle t1 to the eighth cycle t7 according to the operation principle of the DQ flip-flop (the Q level in FIG. 21). The output Q of the DQ flip-flop 5843 is inverted by the inverter 5847, such that the ninth control signal CTRL9 at the high level in the first cycle t0 is generated. At this time, as the input D of the DQ flip-flop 5843, the inversion value of the output Q by the inverter 5845 is supplied.

Figure 22:
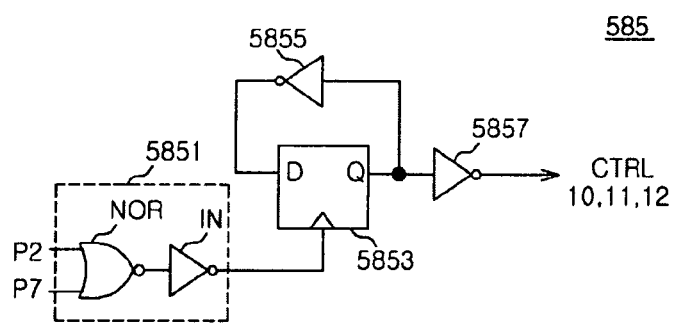
Figure 24:
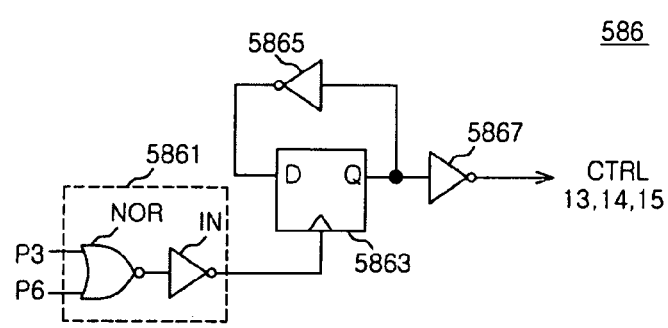
Figure 26:
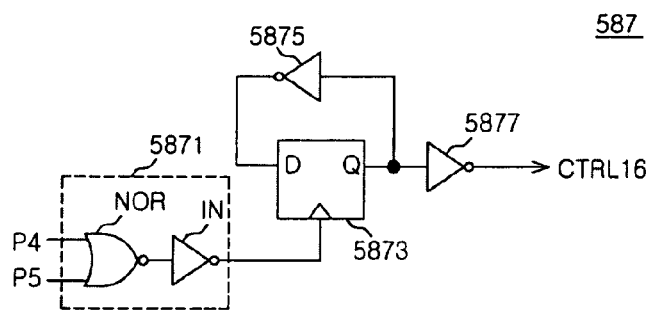

As shown in FIGS. 22, 24, and 26, the fifth pulse combination section 585, the sixth pulse combination section 586, and the seventh pulse combination section 587 include adders 5851, 5861, and 5871, DQ flip-flops 5853, 5863, and 5873, and inverters 5857, 5867, and 5877, respectively. However, in the fifth pulse combination section 585, the third pulse P2 and the eighth pulse P7 are input to the adder 5851. In the sixth pulse combination section 586, the fourth pulse P3 and the seventh pulse P6 are input to the adder 5861. Further, in the seventh pulse combination section 587, the fifth pulse P4 and the sixth pulse P5 are input to the adder 5871.

Figure 23:
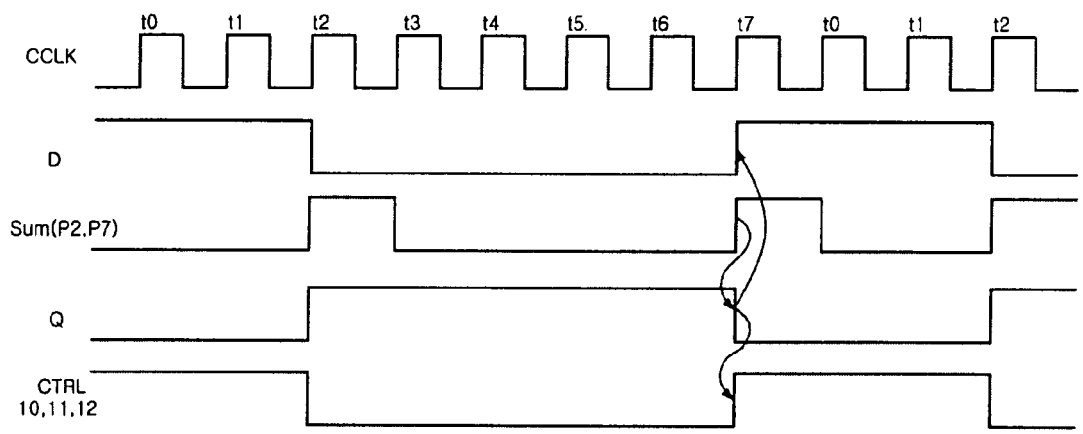

As shown in FIG. 23, the fifth pulse combination section 585 generates the tenth to twelfth control signals CTRL10, CTRL11, and CTRL12 at the high level in the first cycle to the second cycle t0 to t1 and the eighth cycle t7 by the same operation as the pulse combination sections 581 to 584.

Figure 25:
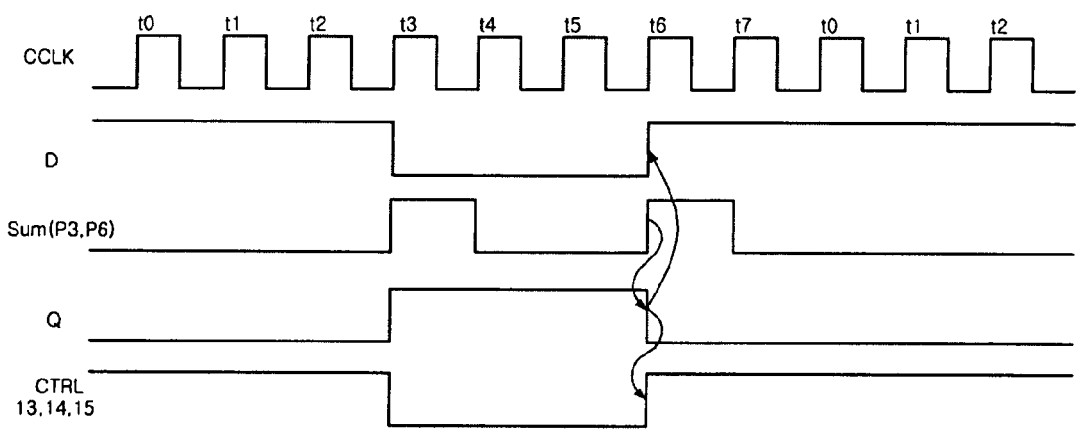

As shown in FIG. 25, the sixth pulse combination section 586 generates the thirteenth to fifteenth control signals CTRL13, CTRL14, and CTRL15 at the high level in the first cycle to the third cycle t0 to t2 and the seventh cycle to the eighth cycle t6 to t7 by the same operation as the pulse combination sections 581 to 585.

Figure 27:
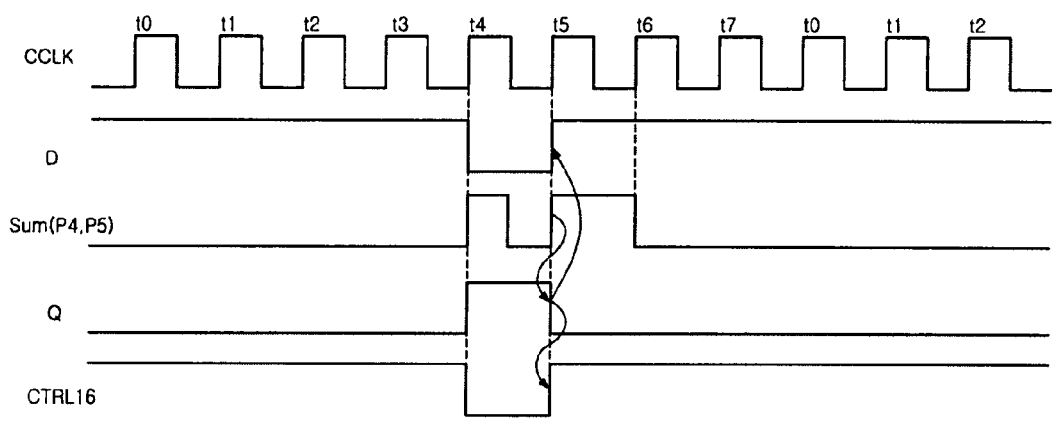

As shown in FIG. 27, the seventh pulse combination section 587 generates the sixteenth control signal CTRL16 at the high level in the first cycle to the fourth cycle t0 to t4 and the sixth cycle to the eighth cycles t5 to t7 by the same operation as the pulse combination sections 581 to 586. At this time, the fifth and sixth pulses P4 and P5 that are input to seventh pulse combination section 587 are successive pulses with no time interval, like the input pulses P0 and P1 of the fourth pulse combination section 584. Therefore, the fifth pulse P4 is modified by the pulse modification section 600 (see FIG. 19), and then the modified fifth pulse is input to the seventh pulse combination section 587, thereby generating a desired pulse.

The operation of the exemplary spread spectrum clock generator having the above-described configuration will now be described.

Figure 5:
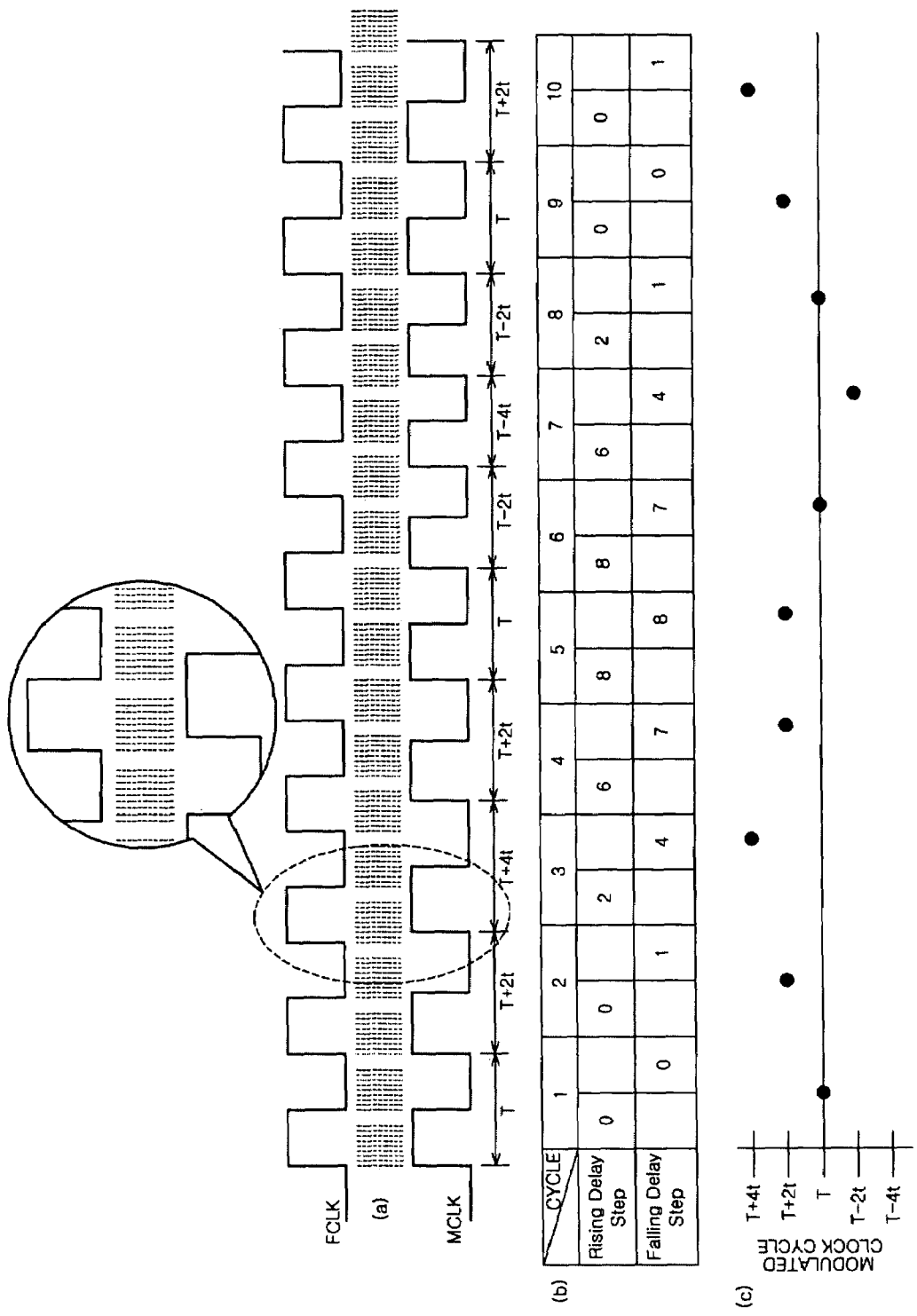
FIGS. 5A to 5C are diagrams illustrating a principle for correcting the duty ratio of a modulated clock MCLK according to an embodiment of the invention.

As shown in FIG. 5, the first cycle of the modulated clock MCLK does not have the rising delay or the falling delay. However, the falling timing in the second cycle of the modulated clock MCLK may be delayed by one step due to the delay components of the circuit itself, such as the signal delay or the like. Accordingly, in order to adjust the duty ratio in the second cycle of the modulated clock MCLK, the rising timing in the third cycle should be delayed by two steps.

The delay of the rising timing by the two steps may be made by supplying the first and second control signals CTRL1 and CTRL2 at the low level and the third to eighth control signals CTRL3 to CTRL8 at the high level, and operating the first and second impedance sections 521 and 522. The method of generating the control signals has been described above in detail, and the description thereof will be omitted.

In the modulated clock MCLK having the rising timing delayed by the two steps, in order to adjust the duty ratio, the falling timing should be delayed by four steps.

The delay of the falling timing by the four steps may be made by supplying the ninth to twelfth control signals CTRL9 to CTRL12 at the low level and the thirteenth to sixteenth control signals CTRL13 to CTRL16 at the high level, and operating the first to fourth impedance sections 521 to 524.

Next, the delay of the rising and falling timing in the fourth cycle to the eighth cycle can be made by supplying the control signals according to the table shown in FIG. 5, thereby obtaining the modulated clock having the corrected duty ratio.

According to an embodiment of the invention, the correction unit that adjusts the rising and falling timing of the modulated clock is provided in the modulation block that modulates the fixed clock. The correction unit may include the control section that generates a plurality of control signals according to the degree of delay per cycles of the modulated clock and the rules regarding the degree of delay, and the delay section that is selectively driven by the control signals so as to delay the modulated clock. The correction unit may delay and modulate the modulated clock such that the duty ratio is adjusted by pulse cycles. Therefore, a modulated clock having a uniform duty ratio and dispersed EMI peak may be generated.

Figure 28:
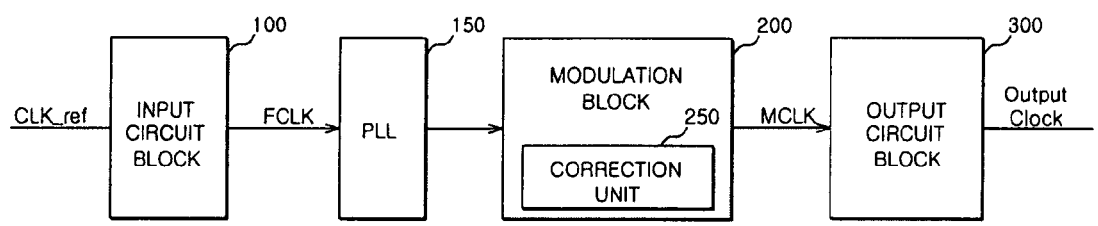
FIG. 28 is a block diagram showing a spread spectrum clock generator according to another embodiment of the invention.

FIG. 28 shows a spread spectrum clock generator according to another embodiment of the invention.

Referring to FIG. 28, a PLL (Phase Locked Loop) 150 may further provided between the input circuit block 100 and the modulation block 200 so as to recover a clock supplied from the input circuit block 100. With the PLL 150, the clock that is delayed and distorted by the input circuit block 100 can be recovered.

The invention is not limited to the above-described embodiments.

In the above-described embodiments, although a period in one cycle of the clock is divided into eight steps in order to measure and correct the delay amount, a period may be divided into a different number of steps, for example, into a larger number of steps for more minute correction.

In the above-described embodiments, the rules of the rising and falling delay steps are determined on an assumption that the modulated clock is delayed by "1" during the initial delay (the rising timing in the second cycle). However, the invention is not limited thereto. For example, the rules of the rising and falling delay steps may be changed according to the initial delay. In this case, the duty ratio of the modulated clock can be adjusted by controlling the control signals according to the rules.

Figure 29:
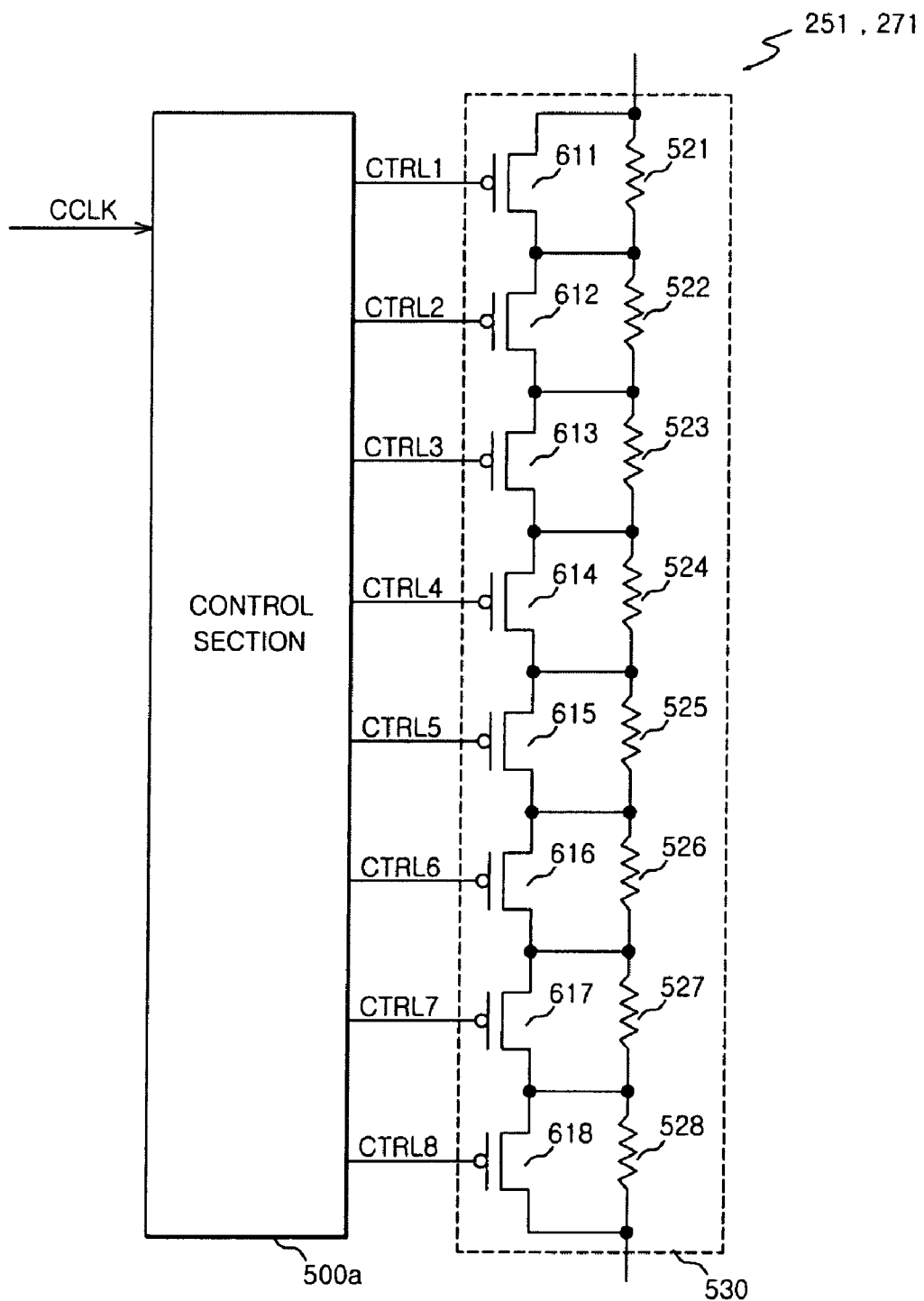
FIGS. 29 and 30 are block diagrams illustrating a correction section according to still another embodiment of the invention.
Figure 30:
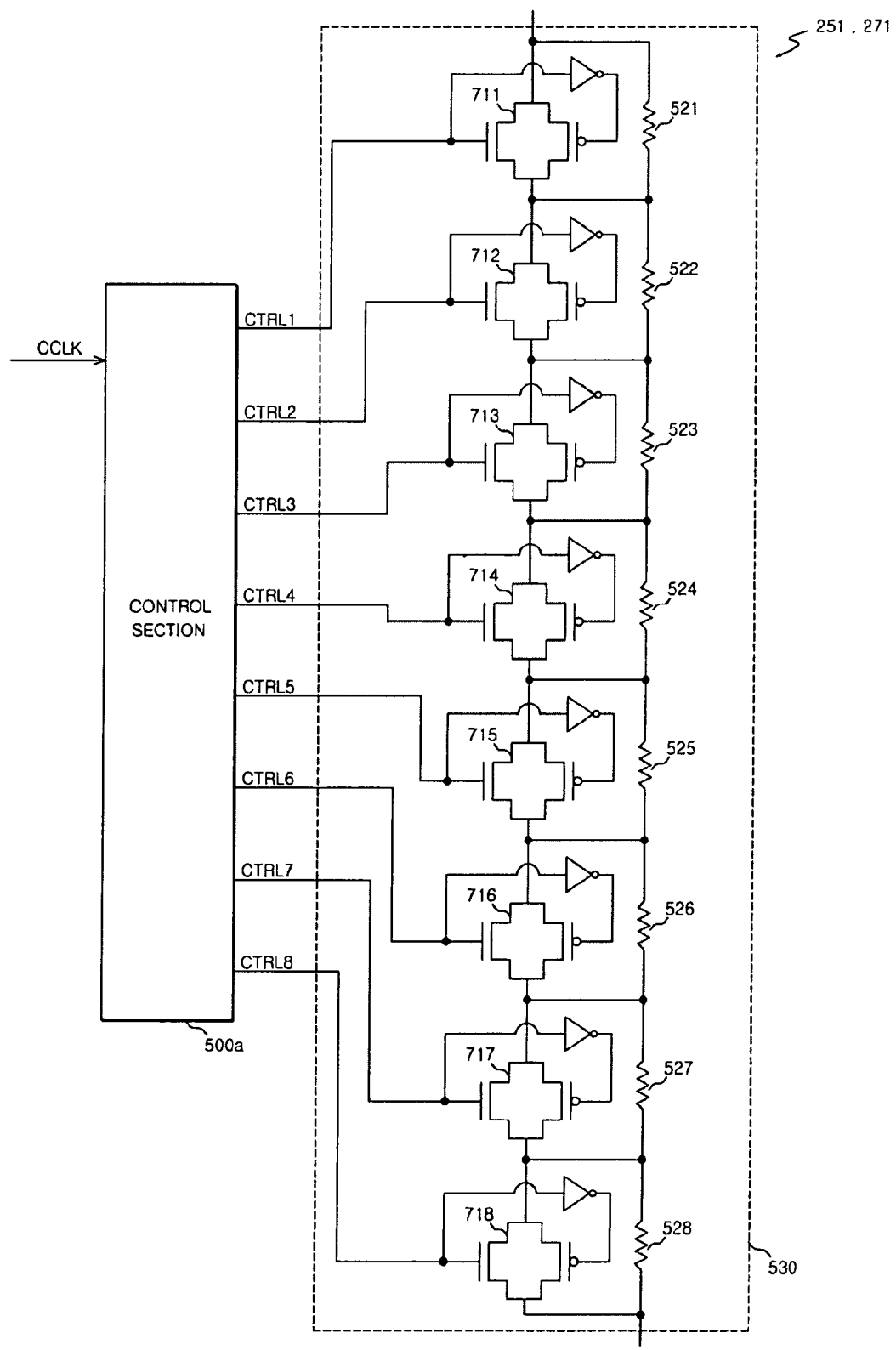

In the above-described embodiments, NMOS transistors are used for the switching sections of the correction section. Alternatively, switching elements that are selectively turned on by a specific signal may be used. For example, PMOS transistors 611 to 618 shown in FIG. 29 or transmission gates 711 to 718 shown in FIG. 30 may be used. As shown in FIG. 29, PMOS transistors are used for the switching sections, the inverters at the output terminals of the multi-pulse generation sections 581 to 587 in the control section 500 are preferably omitted.

In the above-described embodiments, resistors are used for the impedance sections of the correction section. However, the invention is not limited thereto. For example, capacitors, inductors, or other passive or active elements may be used.

Figure 31A:
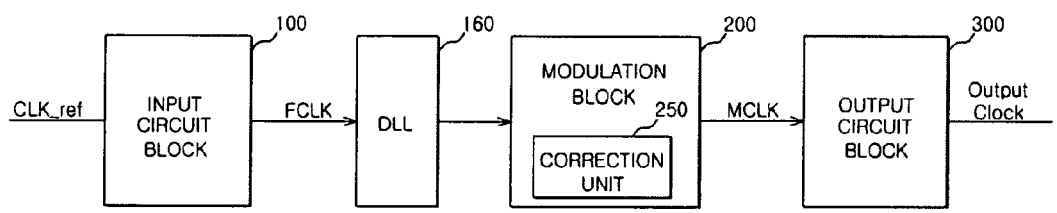
FIG. 31A depicts an embodiment of the invention depicting a Delay Locked Loop between the input circuit block and the modulation block for clock synchronization.
Figure 31B:
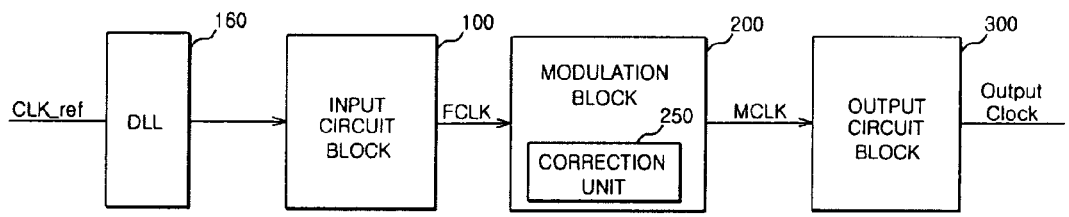
FIG. 31B depicts an embodiment of the invention depicting a Delay Locked Loop provided in front of the input circuit block for clock synchronization.
Figure 31C:
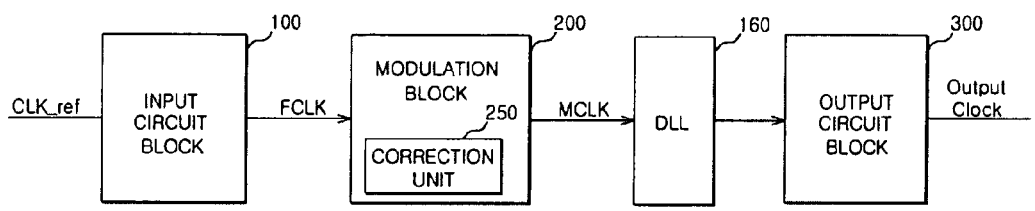
FIG. 31C depicts an embodiment of the invention depicting a Delay Locked Loop provided at the output terminal of the modulation block for clock synchronization.

The spread spectrum clock generator according to an embodiment of the invention can be applied to all devices, including a DRAM device. In particular, when the spread spectrum clock generator is applied to the DRAM device, as shown in FIG. 31A, a DLL (Delay Locked Loop) 160 may be provided between the input circuit block 100 and the modulation block 200 for clock synchronization. Further, as shown in FIG. 31B, the DLL 160 may be provided in front of the input circuit block 100 for clock synchronization. In addition, as shown in FIG. 31C, the DLL 160 may be provided at the output terminal of the modulation block 200 for clock synchronization.

Although the invention has been described in detail by way of the exemplary embodiments, the invention is not limited to the embodiments. It will be apparent to those skilled in the art that various modifications and changes may be made without departing from the scope and spirit of the invention.

As described above, according to an embodiment of the invention, the correction unit that adjusts the rising timing and the falling timing of the modulated clock may be provided in the modulation block that modulates the fixed clock.

With the correction unit, the falling timing (or the rising timing) of the modulated clock may be adjusted to the rising timing (or the falling timing), and the duty ratio of the modulated clock can be set to, for example, approximately 50:50.

Accordingly, a system failure due to an error in the modulated clock may be prevented.

What is claimed is:

1. A clock modulation circuit comprising:
a modulation block configured to receive a fixed clock generated from a reference clock and buffer the fixed clock to generate a modulated clock having a duty ratio; and
a correction unit configured to dispose in the modulation block to correct the duty ratio of the modulated clock,
wherein the correction unit includes a control section configured to generate a plurality of control signals used to control the duty ratio of the modulated clock, and
wherein the control section includes:
a multi-pulse generation section that generates a plurality of clock pulses as much as the number of switching elements, and
a control signal generation section that combines the plurality of clock pulses from the multi-pulse generation section to generate the control signals.

2. The clock modulation circuit of claim 1,
wherein the correction unit corrects the duty ratio by delaying a rising timing and a falling timing of the modulated clock.

3. The clock modulation circuit of claim 2,
wherein the correction unit includes at least one correction section that adjusts the rising timing of the modulated clock, and at least one correction section that adjusts the falling timing of the modulated clock.

4. The clock modulation circuit of claim 3,
wherein the correction section further includes:
a switching section comprising a plurality of switching elements coupled in series, and
an impedance section comprising a plurality of impedance elements correspondingly coupled in parallel to the switching elements and coupled in series to each other,
wherein the control section is configured to generate a plurality of control signals for driving the plurality of switching elements.

5. The clock modulation circuit of claim 4,
wherein each of the switching elements comprising one of a NMOS transistor, a PMOS transistor, or a transmission gate.

6. The clock modulation circuit of claim 4,
wherein the plurality of impedance elements comprise resistors coupled in series and correspondingly coupled in parallel to the switching elements.

7. The clock modulation circuit of claim 4,
wherein a period in one cycle of the modulated clock is divided as much as the number of switching elements or the number of impedance elements, and a pulse width of the modulated clock is adjusted.

8. The clock modulation circuit of claim 7,
wherein the plurality of clock pulses generated by the multi-pulse generation section have a pulse width corresponding to one cycle of a reference control clock, and the clock pulses are pulsed while being sequentially and successively shifted.

9. The clock modulation circuit of claim 8,
wherein the multi-pulse generation section includes a plurality of DQ flip-flops coupled in series and having respective output terminals, to which the reference control clock is input, and
the plurality of clock pulses are respectively generated from the output terminals of the DQ flip-flops.

10. The clock modulation circuit of claim 9,
wherein the multi-pulse generation section further includes a first pulse generation section that logically combines the clock pulses from the output terminals of the DQ flip-flops, and
wherein the first pulse generation section is configured such that a pulse is generated when all of the clock pulses are at a low level.

11. The clock modulation circuit of claim 8,
wherein the control signal generation section includes a plurality of pulse combination sections that combine at least two of the plurality of clock pulses to generate a specific control signal.

12. The clock modulation circuit of claim 11,
wherein the pulse combination section includes:
an adder that receives two clock pulses among the plurality of clock pulses and generates an output having two pulsed portions,
a circuit section that changes a state of a clock in synchronization with an earlier pulse in the output of the adder, maintains the state of the clock, and changes the state of the clock in synchronization with a subsequent pulse to provide an output, and
an inverter that inverts the output of the circuit section.

13. The clock modulation circuit of claim 12,
wherein the circuit section comprises a DQ flip-flop.

14. The clock modulation circuit of claim 12,
wherein control signals having a same signal level among the control signals are generated simultaneously from a single one of the pulse combination sections.

15. The clock modulation circuit of claim 12,
wherein the control signal generation section further includes a pulse modification section that reduces a width of the clock pulse, and
when the pulsed portions of the two clock pulses input to the adder are successive and a single pulse is output from the adder, the width of an earlier pulsed portion of the two clock pulses is reduced, such that an output signal having two pulsed portions is output.

16. The clock modulation circuit of claim 3,
wherein the modulation block includes:
a first inverter having an output terminal and that inverts the fixed clock to provide an output, and
a second inverter having an output terminal and that inverts the output of the first inverter, and
the correction unit is coupled to the output terminal of the first inverter and the output terminal of the second inverter.

17. The clock modulation circuit of claim 3,
wherein the modulation block includes:
a first inverter having an output terminal, that inverts the fixed clock to provide an output and that comprises a first NMOS transistor and a first PMOS transistor,
a second inverter having an output terminal, that inverts the output of the first inverter and that comprises a second NMOS transistor and a second PMOS transistor,
a first rising timing correction section coupled between the first PMOS transistor and the output terminal of the first inverter,
a first falling timing correction section coupled between the first NMOS transistor and the output terminal of the first inverter,
a second rising timing correction section coupled between the second PMOS transistor and the output terminal of the second inverter, and a second falling timing correction section coupled between the second NMOS transistor and the output terminal of the second inverter.

18. The clock modulation circuit of claim 1, further comprising:
an input circuit block that buffers the reference clock.

19. The clock modulation circuit of claim 18, further comprising:
a PLL (Phase Locked Loop) disposed between the input circuit block and the modulation block to recover a clock input from the input circuit block and supply the fixed clock to the modulation block.

20. The clock modulation circuit of claim 1, further comprising:
an output circuit block that buffers the modulated clock to generate an output clock.

21. A spread spectrum clock generator that spreads the frequency spectrum of an input clock, the spread spectrum clock generator comprising:
an input circuit block configured to buffer a reference clock to generate a fixed clock having a frequency spectrum;
a modulation block configured to spread the frequency spectrum of the fixed clock to generate a modulated clock, and include a correction unit for correcting a duty ratio by delaying rising and falling timing of the modulated clock; and
an output circuit block configured to buffer the modulated clock to generate an output clock,
wherein the correction unit includes
a switching section comprising a plurality of switching elements coupled in series,
an impedance section comprising a plurality of impedance elements correspondingly coupled in parallel to the switching elements and coupled in series to each other, and
a control section comprising a multi-pulse generation section for generating a plurality of clock pulses as much as the number of switching elements, and a control signal generation section for combining the plurality of clock pulses from the multi-pulse generation section to generate a control signal.

22. The spread spectrum clock generator of claim 21,
wherein each of the switching elements comprising one of a NMOS transistor, a PMOS transistor, or a transmission gate.

23. The spread spectrum clock generator of claim 21,
wherein the plurality of impedance elements comprise resistors.

24. The spread spectrum clock generator of claim 21,
wherein a period in one cycle of the modulated clock is divided as much as the number of switching elements or the number of impedance elements, and a pulse width thereof is adjusted.

25. The spread spectrum clock generator of claim 21,
wherein the plurality of clock pulses generated from the multi-pulse generation section have a pulse width corresponding to one cycle of a reference control clock, and
the clock pulses are pulsed while being sequentially and successively shifted.

26. The spread spectrum clock generator of claim 23,
wherein the multi-pulse generation section includes a plurality of DQ flip-flop having output terminals and being coupled in series and to which the reference control clock is input, and
the plurality of clock pulses are respectively generated from the output terminals of the DQ flip-flops.

27. The spread spectrum clock generator of claim 26,
wherein the multi-pulse generation section further includes a first pulse generation section that logically combines the clock pulses generated from the output terminals of the DQ flip-flops, and
the first pulse generation section is configured such that a pulse is generated when all of the clock pulses are at a low level.

28. The spread spectrum clock generator of claim 21,
wherein the control signal generation section further includes a plurality of pulse combination sections that combine at least two of the plurality of clock pulses so as to generate a specific control signal, and
the pulse combination section includes
an adder that receives two clock pulses of the plurality of clock pulses and generates an output having two pulsed portions to provide an output,
a DQ flip-flop that delays and latches the output of the adder to provide an output, and
an inverter that inverts the output of the DQ flip-flop.

29. The spread spectrum clock generator of claim 21,
wherein the modulation block further includes
a first inverter having an output terminal and that inverts the fixed clock to provide an output, and
a second inverter having an output terminal and that inverts the output of the first inverter, and
the correction unit coupled to the output terminal of the first inverter and the output terminal of the second inverter.

30. The spread spectrum clock generator of claim 21, further comprising:
a PLL (Phase Locked Loop) coupled between the input circuit block and the modulation block to recover a clock input from the input circuit block and supply the fixed clock to the modulation block.

* * * * *